(12) United States Patent
Morimoto et al.

(10) Patent No.: US 9,073,691 B2
(45) Date of Patent: Jul. 7, 2015

(54) ARTICLE TRANSPORT FACILITY (75) Inventors: Yuichi Morimoto, Omihachiman (JP); Takeshi Chuma, Gifu (JP)

(73) Assignee: Daifuku Co., Ltd., Osaka-shi (JP)

( * ) Notice: Subject to any disclaimer, the term of this patent is extended or adjusted under 35 U.S.C. 154(b) by 395 days.

(21) Appl. No.: 13/568,439

(22) Filed: Aug. 7, 2012

(65) Prior Publication Data
US 2013/0202392 A1 Aug. 8, 2013

(30) Foreign Application Priority Data

Aug. 11, 2011 (JP) ................................ 2011-176184

(51) Int. Cl.
*B65G 1/04* (2006.01)
*H01L 21/677* (2006.01)

(52) U.S. Cl.
CPC ............ *B65G 1/0457* (2013.01); *B65G 1/0407* (2013.01); *B65G 2201/0297* (2013.01); *H01L 21/67733* (2013.01); *H01L 21/67769* (2013.01)

(58) Field of Classification Search
CPC ................. B65G 57/00; B65G 2814/0307
USPC ................................................. 414/282, 940
See application file for complete search history.

(56) References Cited

U.S. PATENT DOCUMENTS

| 7,887,276 | B2* | 2/2011 | Natume | 414/217 |
|---|---|---|---|---|
| 7,972,104 | B2* | 7/2011 | Shiwaku et al. | 414/282 |
| 2004/0109746 | A1* | 6/2004 | Suzuki | 414/373 |
| 2006/0051188 | A1* | 3/2006 | Hoshino | 414/277 |
| 2006/0182553 | A1* | 8/2006 | Yamamoto et al. | 414/278 |
| 2007/0110547 | A1 | 5/2007 | Doherty et al. | |

FOREIGN PATENT DOCUMENTS

| JP | 200410250 A | 1/2004 |
|---|---|---|
| JP | 4123383 B2 | 2/2006 |
| JP | 200652065 A | 2/2006 |
| JP | 200796140 A | 4/2007 |
| JP | 2009173396 A | 8/2009 |

* cited by examiner

*Primary Examiner* — Saul Rodriguez
*Assistant Examiner* — Emery Hassan
(74) *Attorney, Agent, or Firm* — The Webb Law Firm (57) ABSTRACT

An article transport facility includes a first transport conveyer for transporting an article between a first transfer position outside the article storage and a position inside the article storage, and a second transport conveyer for transporting an article between a second transfer position outside the article storage and a position inside the article storage. An article transport vehicle is configured to be capable of transferring an article to or from one of the first transfer position and the second transfer position by vertically moving a grip portion with the article transport vehicle stopped at a transfer stop position in a path defined by a travel rail and is configured to be capable of transferring an article to or from the other of the first transfer position and the second transfer position by slidingly moving the grip portion with the article transport vehicle stopped at the transfer stop position.

16 Claims, 7 Drawing Sheets

ARTICLE TRANSPORT FACILITY

BACKGROUND OF THE INVENTION

1. Field of the Invention

The present invention relates to an article transport facility comprising an article transport vehicle that is capable of traveling along a travel rail provided on a ceiling side and an article storage including a plurality of storage units, the storage units being arranged in a vertical direction and being capable of storing articles that are transported by the article transport vehicle, wherein the article storage is located to a side of the travel rail in plan view and includes a take-in portion for receiving articles to be stored in the storage units from the article transport vehicle and a take-out portion for delivering articles to be retrieved from the storage units to the article transport vehicle.

2. Description of the Related Art

In article transport facilities such as one described above, a travel rail is provided on the ceiling side such that the rail extend by way of or along a plurality of article processors. And article transport vehicles include a grip portion for gripping an article such that the grip portion can be vertically moved or raised and lowered. And the article transport vehicles transport articles among the plurality of article processors by traveling along the travel rail provided on the ceiling side and by vertically moving the grip portion. In addition, an article storage having two or more storage units that are arranged in the vertical direction is provided for, for example, temporarily storing articles transported by the article transport vehicle. The article storage includes a take-in portion for receiving articles to be stored in the storage units from the article transport vehicles and a take-out portion for delivering articles stored in the storage units to the article transport vehicles. And thus, the articles are transferred between an article transport vehicle and the article storage through the take-in portion and the take-out portion.

Examples of conventional article transport facilities include a facility having two transport conveyers that are capable of transporting articles between a transfer position located outside an article storage and under the travel rail, and an inside position located inside the article storage with the two transport conveyers functioning as the take-in portion and the take-out portion. (See, for example, JP Publication of Application No. 2004-10250, hereinafter referred to as "Patent Document 1"). In the facility described in Patent Document 1, an article transport vehicle is configured to be able to transfer an article to or from transfer positions located below the travel rail and on transport conveyers by vertically moving a grip portion. Thus, the articles are transferred between the article transport vehicle and the transport conveyers at the transfer positions of the transport conveyers. And two transport conveyers are provided and arranged next to each other in the travel direction of the travel rail with one transport conveyer provided to function as a take-in portion for receiving articles in its transfer position from the article transport vehicle and the other transport conveyer provided to function as a take-out portion for delivering articles in its transfer position to the article transport vehicle.

In another conventional article transport facility is one in which no such transport conveyers are provided and in which storage units of the article storage are used as a take-in portion and a take-out portion. (See, for example, JP Publication of Application No. 2009-173396, hereinafter referred to as "Patent Document 2"). In the facility described in Patent Document 2, an article transport vehicle is configured not only to be able to vertically move the grip portion but also to be able to slidingly move the grip portion along the lateral direction of the travel rail. Thus, the article transport vehicle is configured to be able to transfer an article to or from a transfer location located below the travel rail by vertically moving the grip portion, and to be able to transfer an article to or from a transfer location located to one side of the travel rail by vertically moving the grip portion after the grip portion has been slidingly moved along the lateral direction of the travel rail. And a storage unit, located in the top portion of the article storage that is provided close to the travel rail such as a location to one side of the travel rail, is configured to be used as a take-out portion (or a take-in portion). In addition, a storage unit, located one level below the top portion of the article storage is configured to be moved horizontally between a transfer position located outside the article storage and below the travel rail and a storage position inside the article storage. And this storage unit located one level below the top portion of the article storage is configured to be used as a take-out portion (or take-in portion). Thus the article transport vehicle transfers an article to the storage unit that is located one level below the top portion of the article storage and that functions as a take-in portion by vertically moving the grip portion, and transfers an article to the storage unit that is located in the top portion of the article storage and that functions as a take-out portion by vertically moving the grip portion after the grip portion has been slidingly moved along the lateral direction of the travel rail.

When transferring an article between the article transport vehicle and the article storage, the article transport vehicle may have to perform, in succession, a storage operation in which an article is transferred to the take-in portion and a retrieval operation in which an article is transferred from the take-out portion. In the facility described in Patent Document 1, the article transport vehicle firstly transfers the article to the transfer position of the transport conveyer that functions as the take-in portion by traveling to a stop position that corresponds to the transport conveyer that functions as the take-in portion and by vertically moving the grip portion to perform the storage operation. Next, the article transport vehicle transfers the article from the transfer position of the transport conveyer that functions as the take-out portion by traveling to a stop position that corresponds to the transport conveyer that functions as the take-out portion and by vertically moving the grip portion to perform the retrieval operation. As such, in the facility described in Patent Document 1 described above, because the transport conveyer that functions as the take-in portion and the transport conveyer that functions as the take-out portion are spaced apart in the travel direction of the travel rail, the article transport vehicle must travel to the stop position corresponding to the transport conveyer that functions as the take-out portion after performing the storage operation. The travel takes additional time, which leads to reduction in transporting efficiency.

In the facility described in Patent Document 2, the storage units of the article storage are used as the take-in portion and the take-out portion. And the storage unit that functions as the take-in portion and the storage unit that functions as the take-out portion are arranged such that they overlap in the vertical direction. Therefore, the position at which the article transport vehicle transfers the article to the storage unit that functions as the take-in portion coincides, in the travel direction of the travel rail, with the position at which the article transport vehicle transfers the article to the storage unit that functions as the take-out portion. As such, the article transport vehicle can perform the retrieval operation without having to travel after performing the storage operation; thus, the problem of reduction in transporting efficiency can be avoided.

However, in the facility described in Patent Document 2, because the storage unit of the article storage is used as the take-out portion (or take-in portion), the installation location of article storage is limited to a location close to the travel rail, such as a position located to a side of and close to the travel rail. That is, in the facility described in Patent Document 2, articles are transferred to the storage unit of the article storage that functions as the take-out portion (or take-in portion) by slidingly moving the grip portion along the lateral direction of the travel rail. Therefore, the installation location for the article storage is limited to within the area in which the grip portion can be slidingly moved from the travel rail; thus, the article storage cannot be installed in the position away from the travel rail.

In addition, in the facility described in Patent Document 2, because the storage units located in the top portion and one level below the top portion of the article storage are used as the take-in portion and the take-out portion, the take-in portion and the take-out portion are located at high locations in the article storage. Therefore, a human operator needs to perform work on the take-in portion and the take-out portion that are located high above the ground, for example, to service the storage units that are used as the take-in portion and the take-out portion, which makes it difficult to service these portions.

The present invention was made in light of this point, and its object is to provide an article transport facility which can shorten required time to improve transporting efficiency even when performing, in succession, a storage operation in which an article is transferred to the take-in portion and a retrieval operation in which an article is transferred from the take-out portion and without limiting the installation location for the article storage to provide greater freedom in the location of the article storage.

SUMMARY OF THE INVENTION

In order to achieve this object, an article transport facility in accordance with the present invention comprises: an article transport vehicle that is capable of traveling along a travel rail provided on a ceiling side; an article storage including a plurality of storage units, the storage units being arranged in a vertical direction and being capable of storing articles that are transported by the article transport vehicle, wherein the article storage is located to a side of the travel rail in plan view and includes a take-in portion for receiving articles to be stored in the storage units from the article transport vehicle and a take-out portion for delivering articles to be retrieved from the storage units to the article transport vehicle; a first transport conveyer for transporting an article between a first transfer position outside the article storage and a position inside the article storage; a second transport conveyer, located outside the article storage and at a higher position than the first transport conveyer, for transporting an article between a second transfer position that is outside the article storage and that is located closer to the article storage than the first transfer position in plan view and a position inside the article storage; wherein the article transport vehicle includes a grip portion for gripping an article such that the grip portion can be vertically moved and slidingly moved in a lateral direction of the travel rail, wherein the article transport vehicle is configured to be capable of transferring an article to or from one of the first transfer position and the second transfer position by vertically moving the grip portion with the article transport vehicle stopped at a transfer stop position in a path defined by the travel rail, and is configured to be capable of transferring an article to or from the other of the first transfer position and the second transfer position by slidingly moving the grip portion with the article transport vehicle stopped at the transfer stop position, wherein one of the first transport conveyer and the second transport conveyer is configured to function as the take-in portion, and the other of the first transport conveyer and the second transport conveyer is configured to function as the take-out portion.

With such a configuration, since the article transport vehicle is configured to be capable of transferring an article to or from one of the first transfer position and the second transfer position by vertically moving the grip portion with the article transport vehicle stopped at the transfer stop position, an article can be transferred from the article transport vehicle to, for example, the first transfer position of the first transport conveyer. And the first transport conveyer can transport the article from the first transfer position to inside the article storage. Thus, the first transport conveyer, for example, can be configured to function as the take-in portion.

In addition, since the article transport vehicle is configured to be capable of transferring an article to or from the other of the first transfer position and the second transfer position by slidingly moving the grip portion with the article transport vehicle stopped at the transfer stop position, an article can be transferred at the second transfer position from the second transport conveyer to the article transport vehicle after transporting an article from inside the article storage to the second transfer position with the second transport conveyer. Thus, the second transport conveyer, for example, can be configured to function as the take-out portion.

Not only can the first and the second transport conveyers be configured to function as the take-in portion and the take-out portion respectively, the first and the second transport conveyers can conversely be configured to function as the take-out portion and the take-in portion respectively.

As such, since one of the first transport conveyer and the second transport conveyer is configured to function as the take-in portion while the other of the first transport conveyer and the second transport conveyer is configured to function as the take-out portion, the first transport conveyer may be provided to connect the first transfer position and a position inside the article storage while the second transport conveyer may be provided to connect the second transfer position and a position inside the article storage even if the article storage is installed at a location away from the travel rail in the lateral direction thereof. Therefore, articles may be delivered and received (i.e. transferred) between the article transport vehicle and article storage by providing the first transport conveyer and the second transport conveyer as a take-in portion and a take-out portion even when the article storage is located at any desired location without limiting the installation location of article storage. In addition, it is also possible, for example, to provide the first transport conveyer and the second transport conveyer at low positions in the vertical direction, which facilitates the maintenance work performed by an operator.

And an article can be transferred to or from both first transfer position of the first transport conveyer and the second transfer position of the second transport conveyer with the article transport vehicle stopped at the same transfer stop position in the path defined by the travel rail. Therefore, when performing the storage operation in which an article is transferred to the take-in portion and the retrieval operation in which an article is transferred from the take-out portion in succession, the article transport vehicle can perform the retrieval operation without having to travel after performing the storage operation; therefore, the time required to perform these operations can be shortened, which leads to an improved transporting efficiency.

Alternatively, an article transport facility in accordance with the present invention may comprise: a rail supported by a ceiling; an article storage including a plurality of storage units that are arranged in a vertical direction and are configured to store articles, wherein the article storage is located to a side of the rail in plan view; a first transport conveyer, provided to the article storage such that the first transport conveyer projects from the article storage, for transporting an article between a first transfer position outside the article storage and a position inside the article storage; a second transport conveyer, provided to the article storage such that the second transport conveyer projects from the article storage and is located at a higher position than the first transport conveyer, for transporting an article between a second transfer position that is located outside the article storage and is closer to the article storage than the first transfer position in plan view and a position inside the article storage; an article transport vehicle configured to travel on the rail, wherein the article transport vehicle includes a lift for vertically moving a grip portion for gripping an article, and a sliding movement operation mechanism for moving the grip portion and the lift in a lateral direction between a retracted position at which the grip portion overlaps with the article transport vehicle in plan view and a side position displaced from the retracted position in the lateral direction, wherein, the first transport conveyer is located such that the first transfer position is located directly below one of the retracted position and the side position of the grip portion when the article transport vehicle is stopped at a transfer stop position in a path defined by the rail, wherein the second transport conveyer is located such that the second transfer position is located directly below the other of the retracted position of the grip portion and the side position when the article transport vehicle is stopped at the transfer stop position and such that an article can be transferred to the first transfer position of the first transport conveyer by lowering the article directly below from the article transport vehicle.

DESCRIPTION OF THE PREFERRED EMBODIMENTS

Embodiments of the article transport facility in accordance with the present invention are described next with reference to the drawings.

First Embodiment

Figure 1:
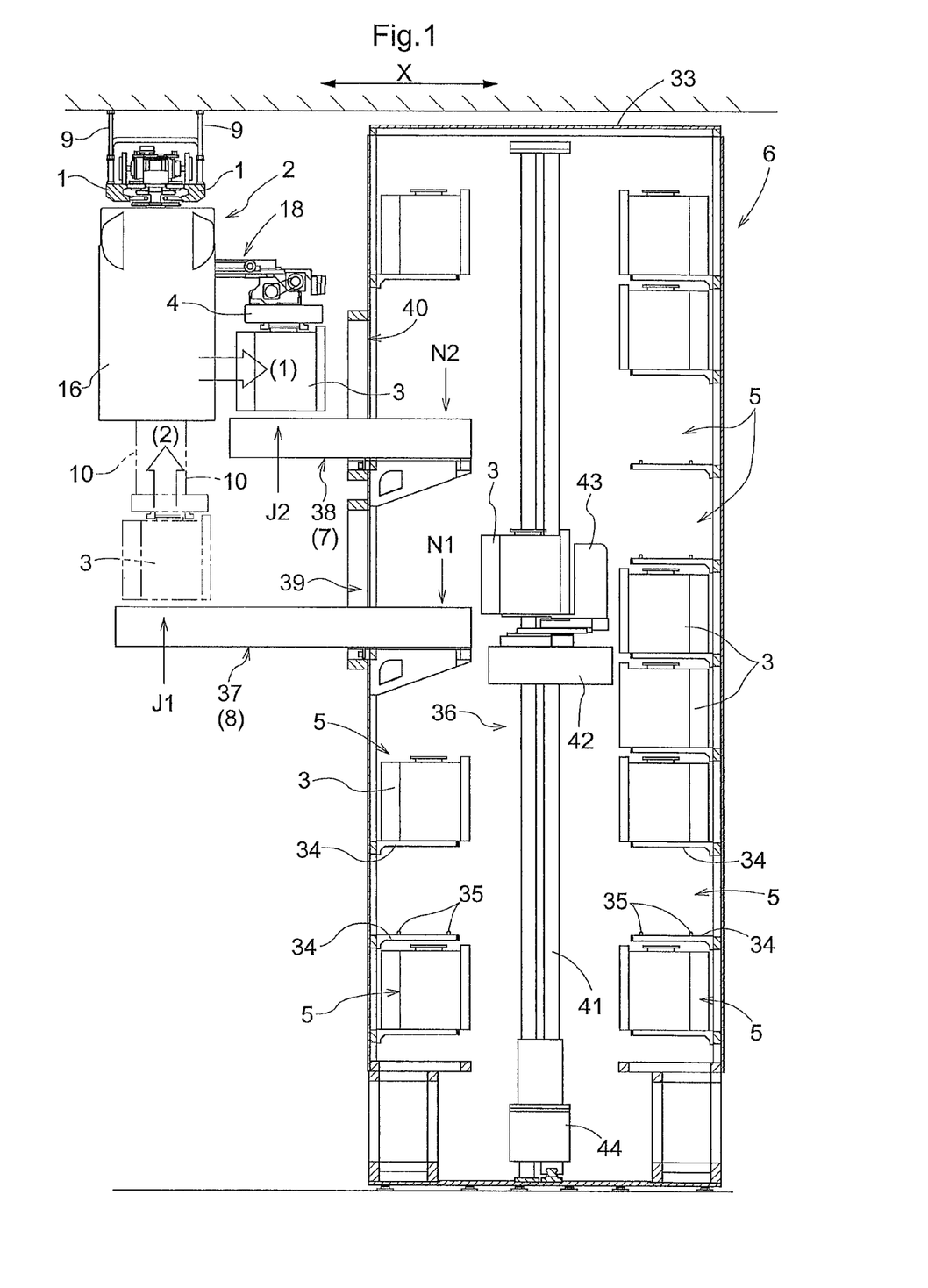
FIG. 1 shows a cross section of an article transport vehicle and an article storage.
Figure 2:
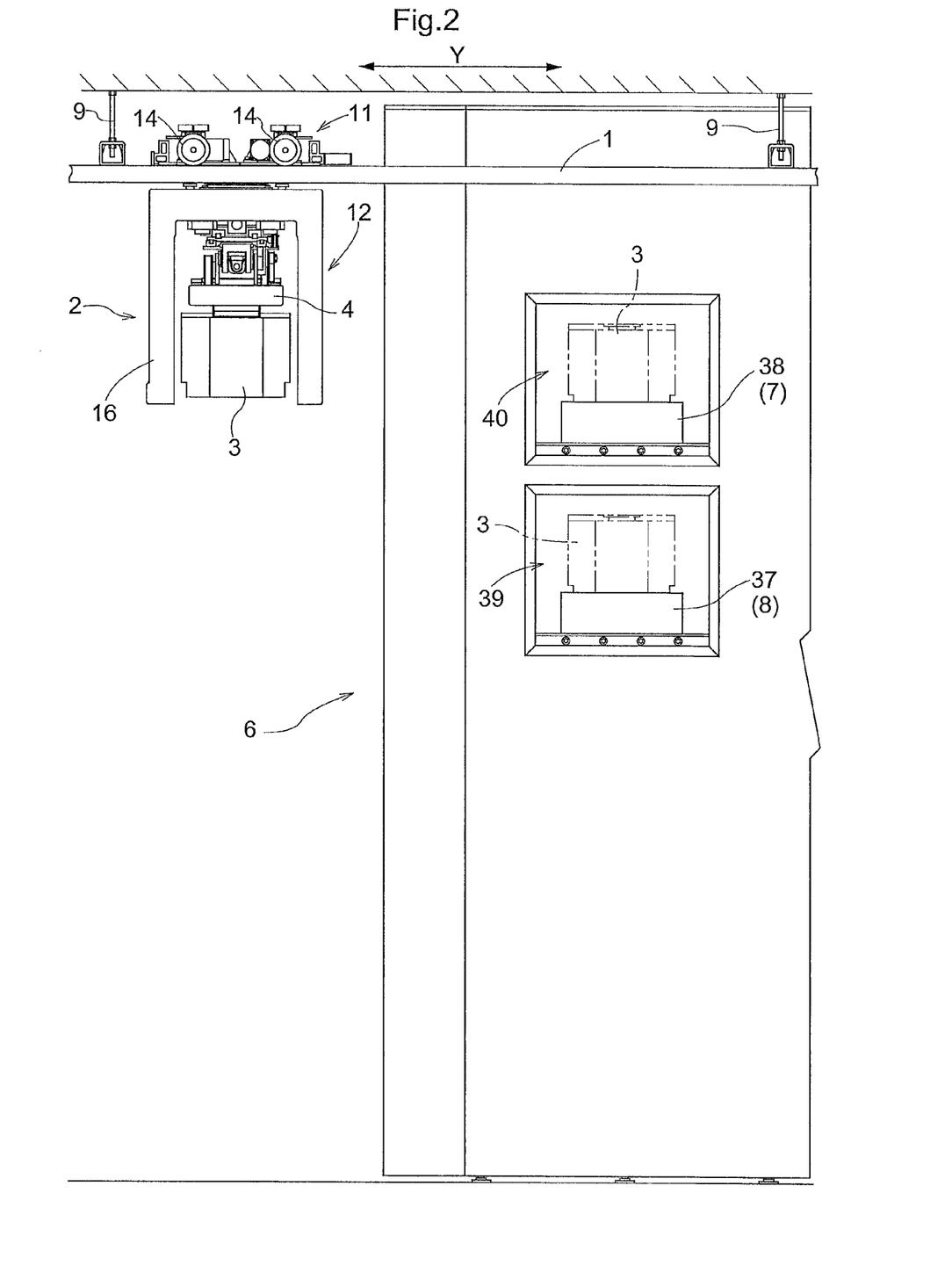
FIG. 2 is a side view showing the article transport vehicle and the article storage.

As shown in FIGS. 1 and 2, the article transport facility includes at least one article transport vehicle 2 which can or is configured to be able to travel along travel rails 1 that are provided on the ceiling side or supported by the ceiling. This article transport vehicle 2 transports an article 3 among a plurality of article processors (not shown) provided on the floor side. FIG. 1 shows a principal portion of the article transport facility as seen along the travel direction of the travel rails 1 (as seen along the direction Y in FIG. 2) whereas FIG. 2 shows the principal portion of the article transport facility as seen along the lateral direction of the travel rails 1 (as seen along the direction X in FIG. 1). Containers that hold semiconductor substrates are the article 3 to be transported in this article transport facility. And article processors perform various processes on the substrates in the articles. While not shown, the travel rails 1 extend along or by way of a plurality of article processors. And the article transport vehicle 2 travels along the travel rails 1 and vertically moves a grip portion 4 for gripping an article 3 to transport articles 3 among the plurality of article processors.

When transporting an article 3 to an article processor with the article transport vehicle 2, the article processor may not be able to accept an article 3 depending on the delivery timing of the article because, for example, the article processor is currently processing another article 3. To solve this problem, as shown in FIGS. 1 and 2, an article storage 6 is provided with a plurality of storage units 5 arranged in the vertical direction to temporarily store articles 3 transported by the article transport vehicle 2. This article storage 6 is located at a side of the travel rails 1 (that is, a position to a side of and near the travel rails 1 in plan view) and is configured to be able to receive articles 3 to be stored in the storage units 5 from the article transport vehicle 2 through a take-in portion 7, and to deliver or transfer articles 3 to be retrieved from the storage units 5 to the article transport vehicle 2 through a take-out portion 8.

The travel rails 1 are fixedly provided to a ceiling portion, i.e., suspended from the ceiling, by means of suspending supports 9. The article transport vehicle 2 includes a grip portion 4 for suspending and gripping an article 3 such that the grip portion 4 can be vertically moved or raised and lowered, and such that the grip portion 4 can be slidingly moved along the lateral direction of the travel rails 1 (direction X in FIG. 1). The grip portion 4 can be moved vertically by spooling or feeding out belts 10 while the article transport vehicle is stopped. Wires, for example, may be used instead of the belts 10.

(Article Transport Vehicle)

Figure 3:
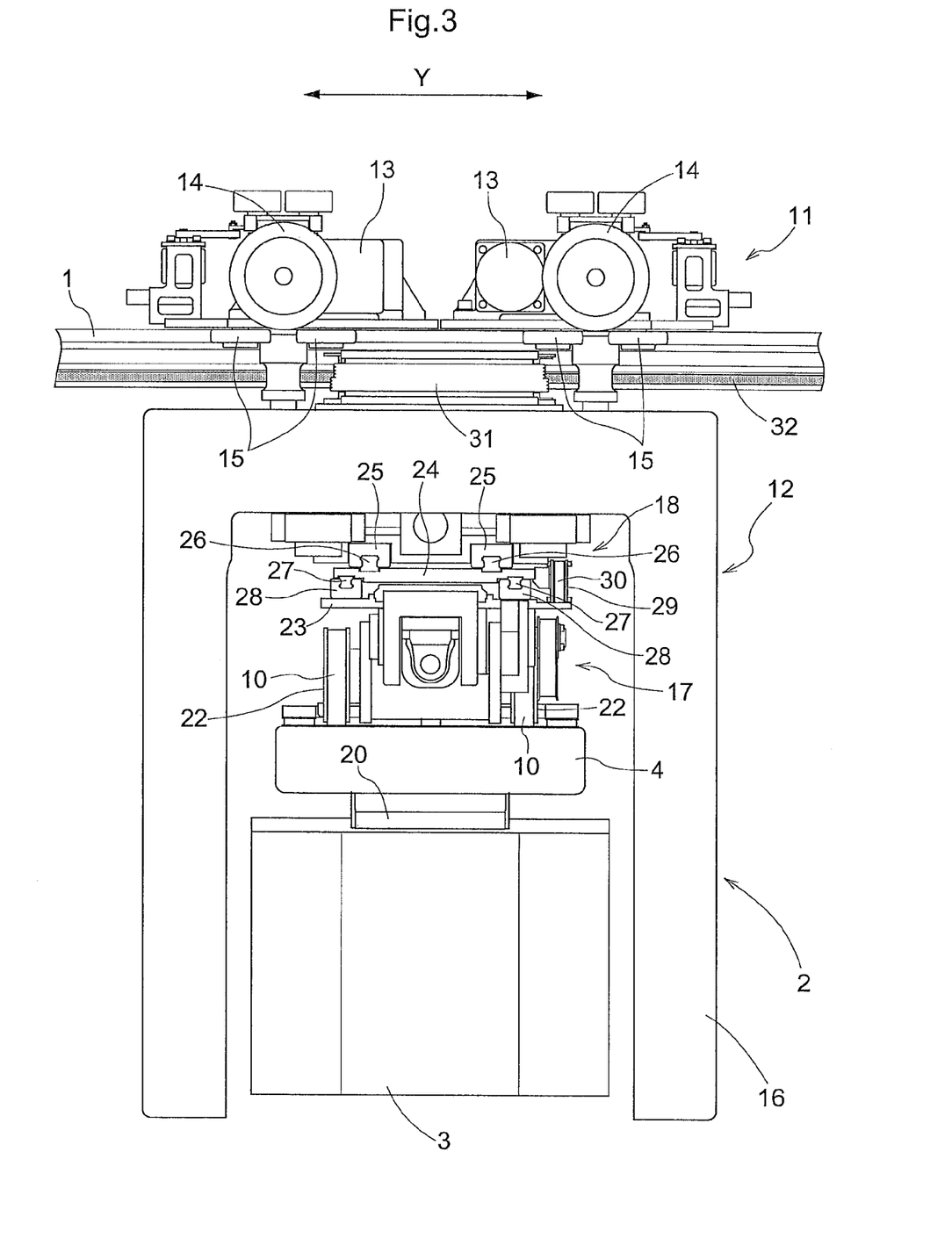
FIG. 3 is a side view of the article transport vehicle.
Figure 4:
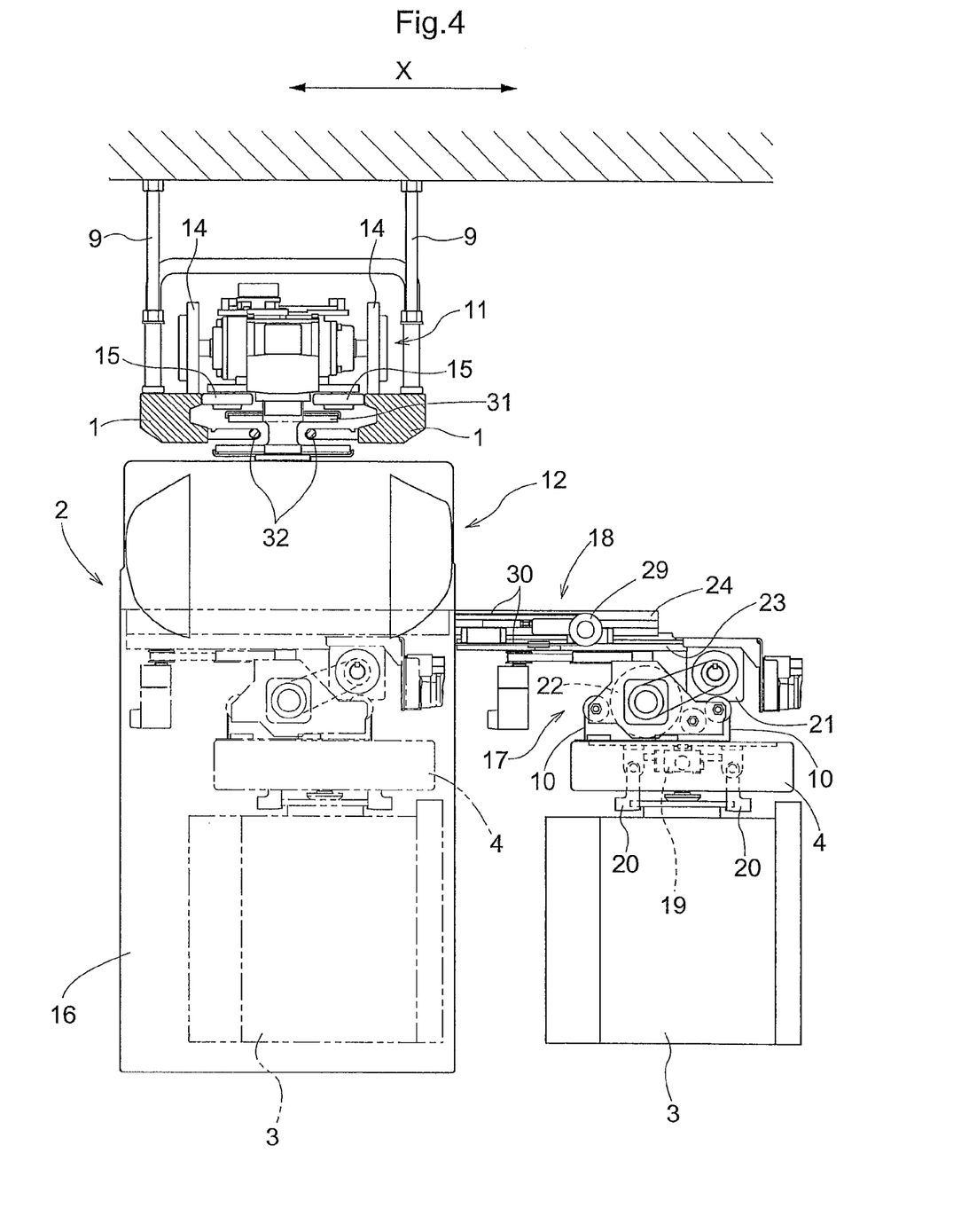
FIG. 4 is a front view of the article transport vehicle.

As shown in FIGS. 3 and 4, the article transport vehicle 2 includes a travel drive portion 11 for traveling on the travel rails 1 and an article support 12 which is suspended and supported by the travel drive portion 11 such that the article support 12 is located below the travel rails 1. FIG. 3 is a side view of the article transport vehicle 2 as seen along the lateral direction of the travel rails 1 (or, as seen along direction X in FIG. 4). FIG. 4 is a front view of the article transport vehicle 2 as seen along the travel direction of the travel rails 1 (or, as seen along direction Y in FIG. 3) and shows the grip portion 4 with solid lines when it is slidingly moved to a side position that is located to one side of the travel rails 1 in plan view and the grip portion 4 with dotted lines when it is at a retracted position where it overlaps completely in plan view with the travel rails 1 and the article support 12. Hereinafter, the lateral direction of the travel rails 1 which is the direction X in FIG. 4 will be referred to as "lateral direction" for short, whereas the travel direction along the travel rails 1 which is direction Y in FIG. 3 will be referred to as the "travel direction" for short.

A pair of right and left travel rails 1 that are spaced apart along the lateral direction (direction X in FIG. 4) are provided. The travel drive portion 11 includes travel wheels 14 which are driven and rotated by drive motors 13 and which roll on the top horizontal surfaces of the pair of right and left travel rails 1, and freely-rotatable travel guide wheels 15 which are in contact with the side faces—of the pair of right and left travel rails 1—which extend vertically and which face each other. And the article transport vehicle 2 travels while it is guided by the travel rails 1 by virtue of the fact that the travel wheels 14 are driven and rotated about axes that extend in the lateral direction of the article transport vehicle 2 by the drive motors 13 and that the travel guide wheels 15 which can rotate freely about the vertical axes are in contact with and are guided by the pair of right and left travel rails 1.

A pair of right and left travel wheels 14 are provided at lateral end portions of the article transport vehicle 2. And two such pairs of right and left travel wheels 14 are provided with one pair being spaced apart from the other pair in the fore and aft direction of the article transport vehicle 2, with the total of four travel wheels 14 provided on each article transport vehicle 2. Four travel guide wheels 15 are provided on one lateral side of the article transport vehicle 2, and four travel guide wheels 15 are provided on the other lateral side. And on each side, two of the four travel guide wheels 15 are located forwardly and rearwardly of the front travel wheel 14 whereas the remaining two travel guide wheels are located forwardly and rearwardly of the rear travel wheel 14. Thus, on each side, two travel guide wheels 15 are spaced apart from the other two travel guide wheels 15 in the fore and aft direction of the article transport vehicle 2 with the total of eight travel guide wheels 15 provided on the article transport vehicle 2.

The article support 12 includes a cover 16 which has a shape of a downwardly opening bracket in a side view and which extends in the travel direction (direction Y in FIG. 3) and has a forward end portion and a rearward end portion that extend downwardly. And the grip portion 4 is located in the space between the forward end portion and the rearward end portion of the cover 16. That is, the cover 16 includes a vertically extending forward end portion, a vertically extending rearward end portion which is spaced apart in the travel direction from the forward end portion, and an intermediate portion which connects the upper portion of the forward end portion and the upper portion of the rearward end portion. In the article support 12, the lower side of the cover 16 is open and the grip portion 4 is moved vertically or raised and lowered through this open space. And both lateral sides of the cover 16 are also open (with "lateral" referring to the direction X in FIG. 4) and the grip portion 4 is slidingly moved along the lateral direction (direction X in FIG. 4) through the open space. The article support 12 includes a vertical movement operation mechanism 17 for vertically moving the grip portion 4 and a sliding movement operation mechanism 18 for slidingly moving the grip portion 4 and the vertical movement operation mechanism 17 along the lateral direction (direction X in FIG. 4).

The grip portion 4 includes a pair of grippers 20 which can be switched, by a gripper motor 19, between a gripping attitude in which an article 3 is gripped as the grippers are moved toward each other and a grip release attitude in which the grip is released as the grippers are moved away from each other. The vertical movement operation mechanism (or a lift) 17 includes a rotating drum 22 which spools the belts 10 and which is driven and rotated by a vertical movement motor 21. The vertical movement operation mechanism 17 is configured to drivingly rotate the rotating drum 22 with the vertical movement motor 21 to vertically move the grip portion 4 and the article 3 gripped by the grip portion 4, and is configured to switch the attitude of the gripper 20 with the gripper motor 19 to cause the grip portion 4 to grip the article or to release the grip on the article.

The grip portion 4 and the vertical movement operation mechanism 17 are provided to a slide movement member 23. And an intermediate slide movement member 24 is interposed between the slide movement member 23 and the cover 16 such that the intermediate slide movement member 24 can be slidingly moved along the lateral direction (direction X in FIG. 4) with respect to the cover 16. This allows the grip portion 4 and the vertical movement operation mechanism 17 to be slidingly moved along the lateral direction (direction X in FIG. 4) with respect to the cover 16. As shown in FIG. 3, the intermediate slide movement member 24 is supported for sliding movement along the lateral direction (direction X in FIG. 4) with respect to the cover 16 by means of first slide rails 25 provided to the cover 16 and second slide rails 26 provided to the top surface of the intermediate slide movement member 24. The slide movement member 23 is supported for sliding movement along the lateral direction (direction X in FIG. 4) with respect to the intermediate slide movement member 24 by means of third slide rails 27 provided to the undersurface of the intermediate slide movement member 24 and fourth slide rails 28 provided to the slide movement member 23.

The sliding movement operation mechanism 18 includes an endless belt 30 that is run over a pair of rotation pulleys 29 (only one rotation pulley 29 is shown and not the other in FIG. 4) that are space apart from each other in the lateral direction (direction X in FIG. 4) and a slide movement motor (not shown) for rotating the rotation pulley 29 to drive and circulate the endless belt 30. And an intermediate portion on one side of the endless belt 30 and between the pair of rotation pulleys 29 is connected to the cover 16 side whereas the other side of the intermediate portion is connected to the slide movement member 23 side. Thus, as the endless belt 30 is drivingly circulated, the intermediate portion of the endless belt 30 that is connected to the cover 16 side and the intermediate portion of the endless belt 30 that is connected to the slide movement member 23 side are moved in opposite directions along the lateral direction (direction X in FIG. 4). With such structure, since the cover 16 and the slide movement member 23 slidingly move in opposite directions with respect to the intermediate slide movement member 24 along the lateral direction (direction X in FIG. 4), the direction in which the intermediate slide movement member 24 slidingly move with respect to the cover 16 coincides with the direction in which the slide movement member 23 slidingly move with respect to the intermediate slide movement member 24. Thus, the sliding movement operation mechanism 18 drives and circulates the endless belt 30 with the sliding movement motor (not shown) to slidingly move the intermediate slide movement member 24 with respect to the cover 16 and to slidingly move the slide movement member 23 with respect to the intermediate slide movement member 24 to slidingly move the grip portion 4 and the vertical movement operation mechanism 17 with respect to the cover 16. And the sliding movement operation mechanism 18 is configured, by driving and circulating the endless belt 30 in one direction and its opposite direction, to slidingly move the grip portion 4 and the vertical movement operation mechanism 17 with the sliding movement motor (not shown) between the retracted position (position shown with dotted lines in FIG. 4) at which the grip portion 4 overlaps completely in plan view with the travel rail 1, the article transport vehicle 2, and its article support 12, and the side position (position shown with solid lines in FIG. 4) off to a side of the travel rails 1 in plan view (that is, position to a side of the travel rails 1 and at which the grip portion 4 does not overlap with the travel rails 1 in plan view).

As shown in FIG. 4, the article transport vehicle 2 includes a power receiving coil 31 located in a central area in the fore and aft direction and in the lateral direction of the article transport vehicle 2, and is configured to receive driving electric power from the electricity supply lines 32 through this power receiving coil 31. A pair of right and left electricity supply lines 32 are provided and supported by the travel rails 1. And the pair of right and left electricity supply lines 32 are arranged such that they are spaced apart from each other in the lateral direction of the article transport vehicle 2 and are located between the pair of right and left travel rails 1. And magnetic field is generated by applying alternating current to the electricity supply lines 32. This magnetic field causes driving electric power to be generated in the power receiving coil 31 so that driving electric power is supplied to the article transport vehicle 2 without contact or contactlessly. With the driving electric power supplied to the power receiving coil 31 from the electricity supply lines 32, the article transport vehicle 2 causes the travel drive portion 11 to travel and the grip portion 4 to be vertically moved, etc. using the driving electric power.

(Article Storage)

The article storage 6 is installed in a location farther away from the travel rail 1 than a location close to the travel rails 1 such as a side of the travel rails 1. More specifically, as shown in FIG. 1, the article storage 6 is installed farther away from the travel rails 1 along the lateral direction (direction X in FIG. 1) than the range in which the grip portion 4 can be slidingly moved from the travel rails 1. That is, in the present embodiment, the article storage 6 is located at a position that is farther away from the article transport vehicle 2 in the horizontal direction with respect to the travel rails 1 than a surface—of the grip portion 4 in the side position—that faces the article storage 6.

As shown in FIGS. 1 and 2, the article storage 6 is formed to define a space of a box shape which is surrounded from above and sides by partitions 33 that define walls that separate the interior of the article storage 6 from the exterior. Movement of the dust or debris from outside the article storage 6 to the interior is prevented to the extent possible by separating the interior of the article storage 6 from the exterior by the partitions 33 in this manner to keep the interior of the article storage 6 clean.

The article storage 6 is configured such that its top end is located higher than the article support 12 of the article transport vehicle 2 and the travel rails 1. This allows the article storage 6 to effectively utilize the space defined to one side of the travel rails 1 by having storage units 5 up to a higher position so that the article storage 6 can store more articles 3 than otherwise. Alternatively, the upper end portion of the article storage 6 may be at substantially the same height as the article transport vehicle 2. The article storage 6 includes columns each of which has a plurality of storage units that are arranged vertically, with two rows of such columns being space apart from each other along the lateral direction (direction X in FIG. 1) and with a plurality of such columns arranged in the travel direction (direction Y in FIG. 2). In other words, a plurality of storage units 5 are arranged in the vertical direction and in the horizontal direction on the inside of a first surface of the article storage 6 that faces the article transport vehicle 2 and a plurality of storage units 5 are arranged in the vertical direction and in the horizontal direction on the inside of a second surface that is spaced apart along the lateral direction from the first surface and that faces the first surface. The article storage 6 includes a plurality of support members 34 such that the support members 34 extend along the lateral direction (direction X in FIG. 1) from sides of the partitions 33 and are spaced apart from each other in the vertical direction. And each storage unit 5 is configured to store an article 3 with the article 3 received and supported by the associated support member 34. A plurality of positioning pins 35 are provided to each support member 34. And each storage unit 5 stores an article 3 with the article 3 being positioned in place by virtue of the fact that the positioning pins 35 are caused to engage the holes provided in the bottom of the article 3.

The article storage 6 includes a first transport conveyer 37 for transporting articles 3 between a first transfer position J1 and a first transport position N1 inside the article storage 6, and a second transfer position J2 which is located outside the article storage 6 and to one side of and near the travel rail 1 and which is closer to the article storage 6 than the first transfer position J1 in plan view. The first transfer position J1 is located outside the article storage 6 and below or beneath the travel rails 1. The second transfer position J2 is located outside the article storage 6 and to one side of and near the travel rail 1 and is closer to the article storage 6 than the first transfer position J1 in plan view.

The first transport conveyer 37 and the second transport conveyer 38 have an identical structure except that their lengths in the transporting direction (lateral direction or direction X in the drawings) are different. The distal end of the first transport conveyer 37 projects farther from the article storage 6 than the distal end of the second transport conveyer 38 by at least the width of the article 3 in the lateral direction. That is, the difference between the amount of projection of the first transport conveyer 37 with respect to the article storage 6 and the amount of projection of the second transport conveyer 38 is large enough to place an article 3 in the first transfer position J1 of the first transport conveyer 37 by lowering the grip portion 4 directly below the article transport vehicle 2. Further, the first transfer position J1 is preferably defined in the distal end region of the first transport conveyer 37. And in the present embodiment, the first transfer position J1 is defined such that, when an article 3 is placed in the first transfer position J1, the location of the surface of the article 3 that faces away from the article storage 6 coincides substantially with the position of the distal end of the first transport conveyer 37 in the lateral direction (direction X in FIG. 1). Here, the expression "coincides substantially with" means that the distance between the distal end of the first transport conveyer 37 and the location of the surface of the article 3 that faces away from the article storage 6 in the lateral direction (direction X in FIG. 1) is less than or equal to, for example, 20% of the width of the article along the lateral direction. Similarly, the second transfer position J2 is preferably defined in the distal end region of the second transport conveyer 38. And in the present embodiment, the first transfer position J2 is defined such that, when an article 3 is placed in the second transfer position J2, the location of the surface of the article 3 that faces away from the article storage 6 coincides substantially with the position of the distal end of the second transport conveyer 38 in the lateral direction (direction X in FIG. 1). Here, the expression "coincides substantially with" means that the distance between the distal end of the second transport conveyer 38 and the location of the surface of the article 3 that faces away from the article storage 6 in the lateral direction (direction X in FIG. 1) is less than or equal to, for example, 20% of the width of the article in the lateral direction. In addition, the position of the second transport conveyer 38 relative to the travel rail 1 is determined such that, when the transport vehicle 2 is stopped at a stop position for transfer, the second transfer position J2 is so located that the sliding movement operation mechanism 18 can move an article 3 to directly above the second transfer position J2. Thus, in the present embodiment, when the transport vehicle 2 is stopped at the stop position for transfer, the first transfer position J1 is located directly below the retracted position of the grip portion 4, and the second transfer position J2 is located directly below the side position of the grip portion 4. Although not shown, each of the first transport conveyer 37 and the second transport conveyer 38 includes a roller conveyor having, for example, a first row of driven rollers consisting of a plurality of driven rollers arranged in the transporting direction, and a second row of driven rollers that is spaced apart from the first row in the travel direction (direction Y in FIG. 2) to receive and support both ends of articles 3. In addition, a vertically movable platform (not shown) which can be moved vertically is provided between the pair of driven rollers, for example, at each of the first transfer position J1, the second transfer position J2, the first transport position N1, and the second transport position N2. And an article 3 can be vertically moved or lowered and raised by vertically moving the vertically movable platform between a supporting position at which the article 3 is received and supported by the driven rollers and a lifted position at which the article 3 is lifted from the driven rollers. Each vertically movable platform includes a plurality of pins that are configured to engage corresponding plurality of groove portions formed in the bottom of the article 3 and supports an article 3 with the article 3 being positioned in place by virtue of the fact that the plurality of pins are caused to engage the groove portions formed in the bottom of the article 3.

The first transport conveyer 37 and the second transport conveyer 38 are located at the same position in the travel direction (direction Y in FIG. 2). And the second transport conveyer 38 is located at a higher position than the first transport conveyer 37 in the vertical direction. In addition, the first transport conveyer 37 and the second transport conveyer 38 are located in an intermediate portion of the article storage 6 in the vertical direction (that is, in a portion which is neither the highest portion nor the lowest portion) such that they are vertically aligned with each other and close to each other in the vertical direction. The locations of the first transport conveyer 37 and the second transport conveyer 38 in the intermediate portion of the article storage 6 in the vertical direction in this manner makes it easier for a human operator to perform maintenance work on the first transport conveyer 37 and the second transport conveyer 38 with a use of, for example, a ladder while avoiding an increase in the time required for the article transport vehicle to transfer an article by vertically moving the grip portion.

As shown in FIG. 2, the first transport conveyer 37 is configured to extend horizontally through a first opening 39 formed in a side of the partition 33 and between the first transfer position J1 and the first transport position N1. The second transport conveyer 38 is configured to extend horizontally through a second opening 40 formed in the same side of the partition 33 and between the second transfer position J2 and the second transport position N2. While not shown, each of the first opening 39 and the second opening 40 is provided with a opening-and-closing member which can be opened and closed. And the first opening 39 and the second opening 40 are closed with the opening-and-closing members when articles 3 are not transported by the first transport conveyer 37 and the second transport conveyer 38.

Thus, the article storage 6 includes two transport conveyers, namely the first transport conveyer 37 and the second transport conveyer 38. And the first transport conveyer 37 functions as a take-out portion 8 through which articles 3 that are being retrieved from the storage unit 5 can be delivered to the article transport vehicle 2 whereas the second transport conveyer 38 functions as a take-in portion 7 through which articles 3 that are being stored in the storage unit 5 can be received from the article transport vehicles 2. More specifically, as shown in FIG. 1, the article transport vehicle is configured to be able to transfer an article 3 to or from the first transfer position J1 in the first transport conveyer 37 by causing the grip portion 4 to be vertically moved directly below the article transport vehicle 2 (that is, at the retracted position). And an article 3 that is to be retrieved from a storage unit 5 is delivered to the article transport vehicle 2 through this article transfer operation by the article transport vehicle 2. In addition, the article transport vehicle 2 is configured to be able to transfer an article 3 to or from the second transfer position J2 in the second transport conveyer 38 by causing the grip portion 4 to be vertically moved after the grip portion 4 has been slidingly moved along the lateral direction (direction X in FIG. 1) to the side position. And the article storage 6 receives an article 3 that is to be stored in a storage unit 5 from the article transport vehicle 2 through this article transfer operation by the article transport vehicle 2. And because the first transport conveyer 37 and the second transport conveyer 38 are located at the same position in the travel direction (direction Y in FIG. 2) and because the second transport conveyer 38 is located at a higher position than the first transport conveyer 37 in the vertical direction, the article transport vehicle stops at the same stop position for transfer in the path along the travel rails 1 when transferring an article 3 to or from the first transfer positions J1 of the first transport conveyer 37, and when transferring an article 3 to or from the second transfer positions J2 of the second transport conveyer 38.

As shown in FIG. 1, the article storage 6 is provided with an article storage transport device 36 which is a stacker crane in the present embodiment. This article storage transport device 36 is configured to be able to move among a stop position for the first transport position N1 of the first transport conveyer 37, a stop position for the second transport position N2 of the second transport conveyer 38, and a stop position for each of the storage units 5 and to be able to transfer articles among the first transport position N1 of the first transport conveyer 37, the second transport position N2 of the second transport conveyer 38, and each of the storage units 5. The article storage transport device 36 includes a traveling carriage 44 capable of traveling in the travel direction (direction Y in FIG. 2), a vertically movable platform 42 capable of vertically moving along a vertical movement guiding mast 41 which is arranged vertically on the traveling carriage 44, and a transfer device 43 provided to the vertically movable platform 42. While the transfer device 43 will not be described in detail because it belongs to the conventional technology, robot arms with one or more pivotable joints, a device with two fork arms that can be extended and retracted, or a device including a roller conveyor, or any other suitable conventional device may be used as the transfer device 43. The article storage transport device 36 is configured to be able to move among a stop position for the first transport position N1 of the first transport conveyer 37, a stop position for the second transport position N2 of the second transport conveyer 38, and a stop position for each of the storage units 5 by causing the traveling carriage 44 to travel and by causing the vertically movable platform 42 to be vertically moved. The article storage transport device 36 transfers an article 3 to or from the first transport position N1 of the first transport conveyer 37, the second transport position N2 of the second transport conveyer 38, or a storage unit 5 by operating the transfer device 43 with the vertically movable platform 42 stopped at the associated stop position.

(Article Transfer Between the Article Transport Vehicle and the Article Storage)

The transfer operation of an article 3 between the article transport vehicle 2 and the article storage 6 is described next.

As shown in FIG. 1, when the article transport vehicle 2 performs a storage operation in which the article transport vehicle 2 transfers an article 3 to the take-in portion 7, the article transport vehicle travels to, and stops at, a transfer stop position (i.e. a stop position for a transfer of an article) in the path defined by the travel rails 1 with the article 3 gripped by the grip portion 4. Then, the article transport vehicle 2 slidingly moves the grip portion 4 along the lateral direction (direction X in FIG. 1) to the side position as shown by the arrow (1) in FIG. 1, vertically moves the grip portion 4, and switches the gripper 20 to transfer the article 3 to the second transfer position J2 of the second transport conveyer 38. Upon receiving the article 3 in the second transfer position J2 from the article transport vehicle 2, the second transport conveyer 38 transports the article 3 from the second transfer position J2 to the second transport position N2. When the article 3 is transported to the second transport position N2 in this manner by the second transport conveyer 38, the article storage transport device 36 receives the article 3 from the second transport position N2, and stores the received article 3 in one of the plurality of storage units 5. Incidentally, the vertically movable platform (not shown) is raised to the lifted position when performing the article transfer between the article transport vehicle 2 and the second transport conveyer 38 at the second transfer position J2 as well as the article 3 transfer between the second transport conveyer 38 and the article storage transport device 36.

When the article transport vehicle 2 performs the retrieval operation in which an article 3 is transferred from the take-out portion 8 to the article transport vehicle 2, the article 3 to be retrieved from the article storage 6 is transported to the first transfer position J1 of the first transport conveyer 37 by the article storage transport device 36 and the first transport conveyer 37 prior to being transferred to the article transport vehicle 2. More specifically, the article storage transport device 36 takes out or moves the article 3, that is stored in the storage unit 5 and that is to be retrieved from the storage unit 5, to the first transport position N1 of the first transport conveyer 37. And the first transport conveyer 37 transports the article 3 taken out by the article storage transport device 36 from the first transport position N1 to the first transfer position J1.

And the article transport vehicle 2 travels to and stops at the transfer stop position in the path defined by the travel rails 1. And the article transport vehicle 2 vertically moves the grip portion 4 in the retracted position, and performs the switch over operation of the gripper 20, and transfers the article 3 from the first transfer position J1 of the first transport conveyer 37, as shown by the arrow (2) in FIG. 1. Upon receiving the article 3 from the take-out portion 8 in this manner, the article transport vehicle 2 travels toward, for example, an article processing device etc. to which the article 3 needs to be transported.

The storage operation and the retrieval operation may be performed in succession. In such case, the storage operation is performed first, after which the retrieval operation is performed. As described before, the first transport conveyer 37 and the second transport conveyer 38 are located at the same position in the travel direction (direction Y in FIG. 2). And the second transport conveyer 38 which projects to the lesser amount from or with respect to the article storage 6 than the first transport conveyer 37 is located upwardly of, or at a higher position than, the first transport conveyer 37 in the vertical direction. Therefore, the transfer stop position for the first transfer position J1 coincides with the transfer stop position for the second transfer position J2; so, the retrieval operation can be performed after performing the storage operation without the article transport vehicle 2 having to travel.

More specifically, the article transport vehicle 2 travels to and stops at the transfer stop position in the path defined by the travel rails 1 with an article 3 gripped by the grip portion 4. The article transport vehicle 2, as shown by the arrow (1) in FIG. 1, slidingly moves the grip portion 4 along the lateral direction (direction X in FIG. 1) to the side position, vertically moves the grip portion 4, and switches the gripper 20 to perform the storage operation in which the article 3 is transferred to the second transfer position J2 of the second transport conveyer 38. And after vertically moving and slidingly moving the grip portion 4 to return the grip portion 4 to the original retracted position, the article transport vehicle vertically moves the grip portion 4 and switches the gripper 20 to perform the retrieval operation in which the article 3 is transferred from the first transfer position J1 of the first transport conveyer 37, as shown by the arrow (2) in FIG. 1, while remaining at the transfer stop position in the path defined by the travel rails 1 without traveling. Since the article transport vehicle 2 can perform a retrieval operation without having to travel after performing a storage operation, the time required to perform these operations can be shortened, which leads to an improved transporting efficiency.

Second Embodiment

Figure 5:
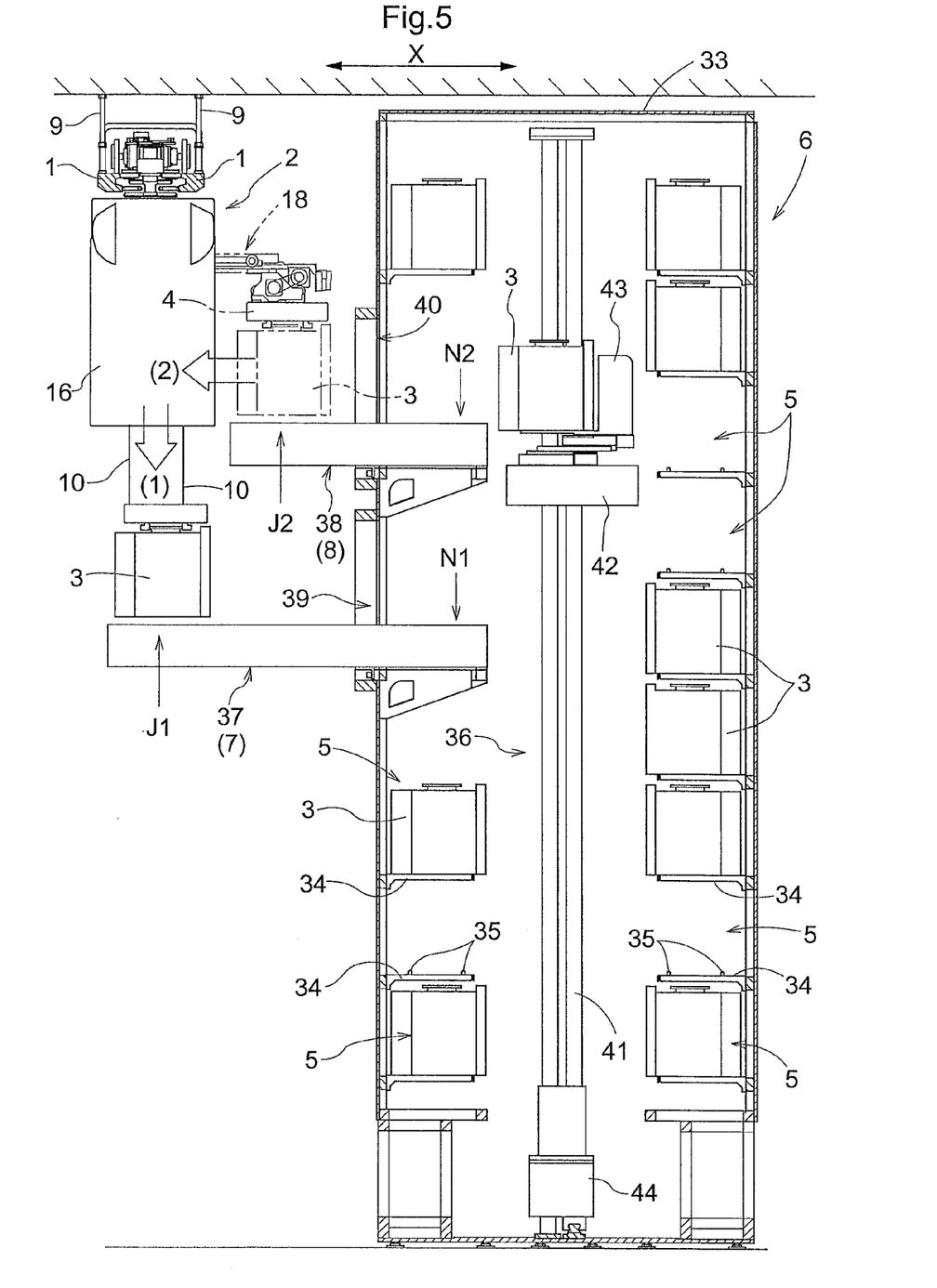
FIG. 5 shows a cross section of the article transport vehicle and the article storage in accordance with the second embodiment.

This second embodiment shown in FIG. 5 is an alternative embodiment for the take-in portion 7 and the take-out portion 8 described in the first embodiment described above and other parts are identical to those in the first embodiment. Accordingly, the description below focuses on the points that are different from the first embodiment. And the parts that are identical to those in the first embodiment bear the identical reference numerals and symbols as those in the first embodiment.

In the first embodiment above, the first transport conveyer 37 is configured to function as a take-out portion 8 whereas the second transport conveyer 38 is configured to function as a take-in portion 7. In contrast, in the second embodiment, the first transport conveyer 37 is configured to function as a take-in portion 7 whereas the second transport conveyer 38 is configured to function as a take-out portion 8, as shown in FIG. 5.

In this second embodiment, when the article transport vehicle 2 performs a storage operation in which the article transport vehicle 2 transfers an article 3 to the take-in portion 7, the article transport vehicle travels to, and stops at, a transfer stop position in the path defined by the travel rails 1 with the article 3 gripped by the grip portion 4. And as shown by the arrow (1) in FIG. 5, the article transport vehicle 2 vertically moves the grip portion 4 at the retracted position, and switches the gripper 20 to transfer the article 3 to the first transfer position J1 of the first transport conveyer 37. Upon receiving the article 3 in the first transfer position J1 from the article transport vehicle 2, the first transport conveyer 37 transports the article 3 from the first transfer position J1 to the first transport position N1. When the article 3 is transported to the first transport position N1 in this manner by the first transport conveyer 37, the article storage transport device 36 receives the article 3 from the first transport position N1, and stores the received article 3 in one of the plurality of storage units 5.

When the article transport vehicle 2 performs the retrieval operation in which an article 3 is transferred from the take-out portion 8 to the article transport vehicle 2, the article 3 to be retrieved from the article storage 6 is transported to the second transfer position J2 of the second transport conveyer 38 by the article storage transport device 36 and the second transport conveyer 38 prior to being transferred to the article transport vehicle 2, which is identical to the retrieval operation in the first embodiment. And the article transport vehicle 2 travels to and stops at the transfer stop position in the path defined by the travel rails 1. Then, the article transport vehicle 2 slidingly moves the grip portion 4 along the lateral direction (direction X in FIG. 5) to the side position as shown by the arrow (2) in FIG. 5, vertically moves the grip portion 4, and switches the gripper 20 to transfer the article 3 from the second transfer position J2 of the second transport conveyer 38 to the article transport vehicle 2. Upon receiving the article 3 from the take-out portion 8 in this manner, the article transport vehicle 2 travels toward, for example, an article processing device etc. to which the article 3 needs to be transported.

Also in this second embodiment, the first transport conveyer 37 and the second transport conveyer 38 are located at the same position in the travel direction (direction Y in FIG. 2). And the second transport conveyer 38 is located upwardly of, or at a higher position than, the first transport conveyer 37 in the vertical direction, which is the identical arrangement as that in the first embodiment above. Other parts of the first transport conveyer 37 and the second transport conveyer 38 as well as the location of the first transfer position J1 and the second transfer position J2 are identical to those in the first embodiment. Therefore, the transfer stop position for the first transfer position J1 coincides with the transfer stop position for the second transfer position J2; so, the retrieval operation can be performed after performing the storage operation without the article transport vehicle 2 having to travel.

Figure 6:
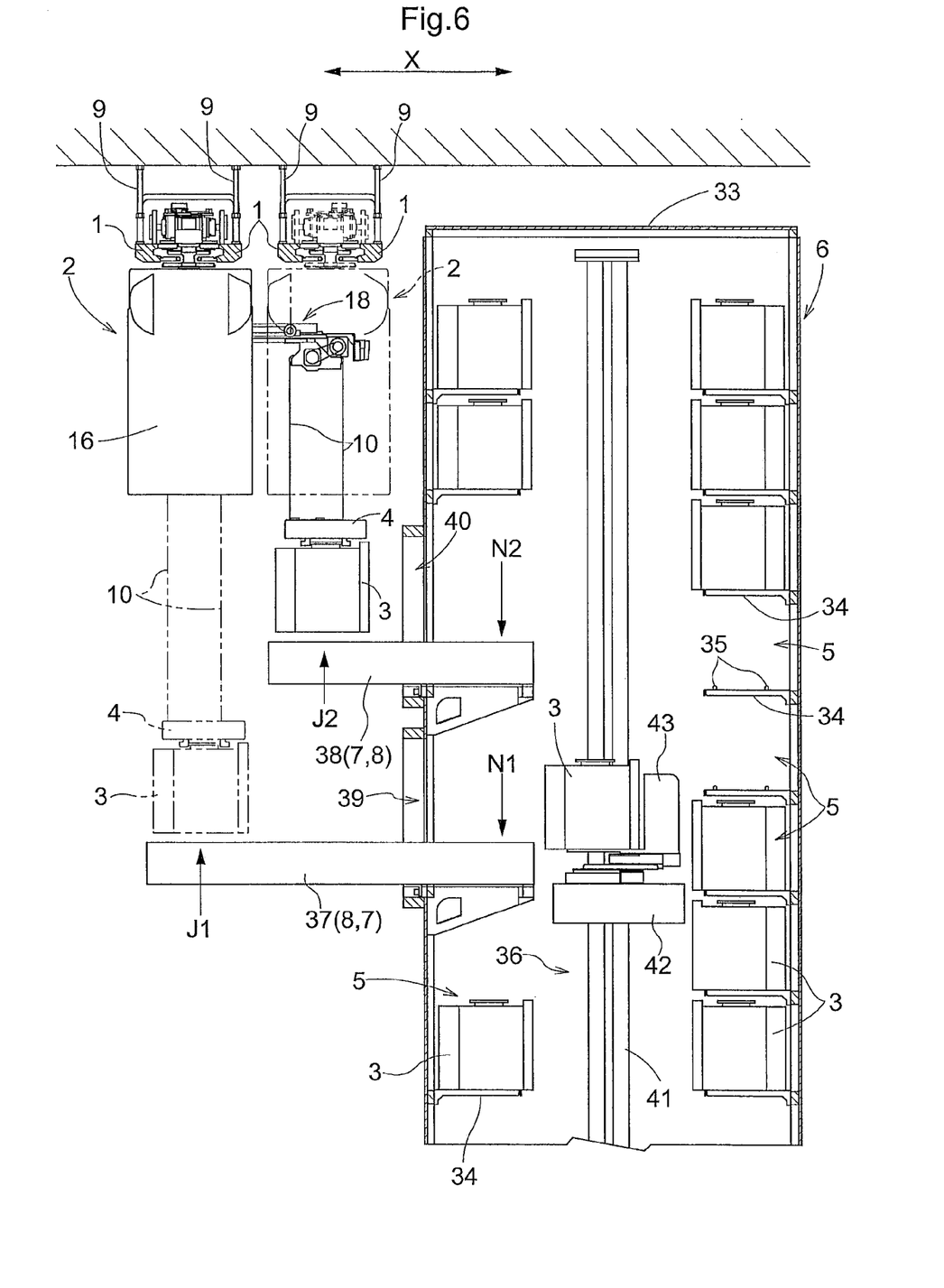
FIG. 6 shows the article transport vehicle and the article storage in accordance with an alternative embodiment, and FIG. 7 also shows the article transport vehicle and the article storage in accordance with the alternative embodiment.
Figure 7:
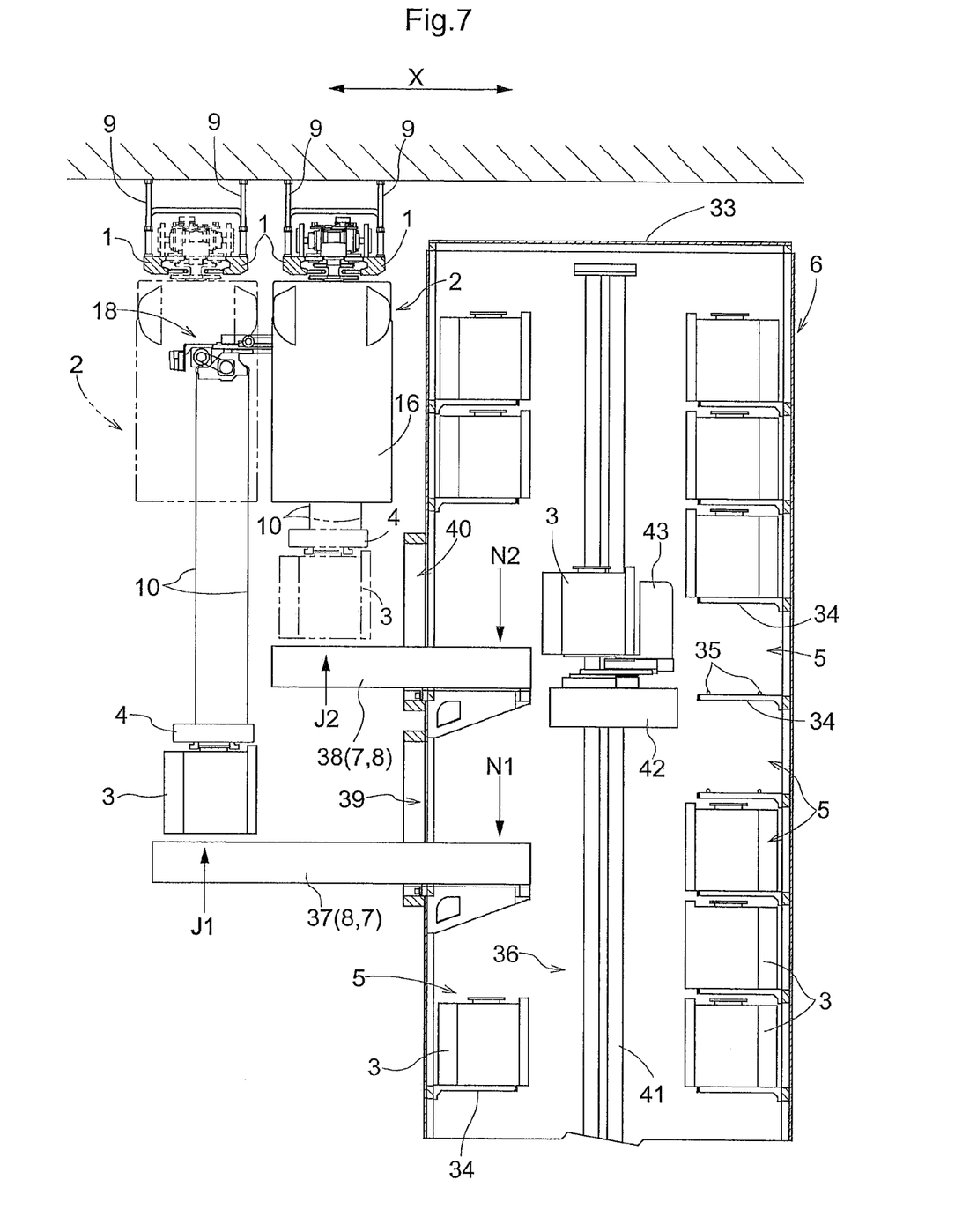

Alternative Embodiments (1) In the first and second embodiments above, as shown in FIGS. 6 and 7, two sets of travel rails 1 may be provided with one set being space part from the other set in the lateral direction of the travel rails 1 (direction X in FIG. 6). And the article transport vehicle 2 may be configured to travel along either of the two sets of the travel rails 1. In this case, as shown in FIG. 6, a position below (preferably directly below) the travel rails 1 located on the left-hand side in the direction X in the figures is defined to be the first transfer position J1 of the first transport conveyer 37 whereas a position below (preferably directly below) the travel rails 1 located on the right-hand side in the direction X in the figures is defined to be the second transfer position J2 of the second transport conveyer 38. Thus, the article transport vehicle 2 that travels along the travel rails 1 located on the left-hand side in the direction X in the figure can transfer an article 3 to or from the first transfer position J1 of the first transport conveyer 37 by vertically moving the grip portion 4 in the retracted position, and can transfer an article 3 to or from the second transfer position J2 of the second transport conveyer 38 by vertically moving the grip portion 4 after slidingly moving the grip portion 4 along the lateral direction (direction X in FIG. 1) to the side position. In addition, as shown in FIG. 7, the article transport vehicle 2 that travels along the travel rails 1 located on the right-hand side in the direction X in the figure can transfer an article 3 to or from the first transfer position J1 of the first transport conveyer 37 by vertically moving the grip portion 4 after slidingly moving the grip portion 4 along the lateral direction (direction X in FIG. 1) to the side position, and can transfer an article 3 to or from the second transfer position J2 of the second transport conveyer 38 by vertically moving the grip portion 4 in the retracted position.

Also in this case, the first transport conveyer 37 can function as the take-out portion 8, and the second transport conveyer 38 can function as the take-in portion 7. Alternatively and conversely, the first transport conveyer 37 can function as the take-in portion 7, and the second transport conveyer 38 can function as the take-out portion 8.

(2) In the first and second embodiments above, as shown in FIGS. 1 and 5, the travel rails 1 are located farther away from the article storage 6 than the second transfer position J2 of the second transport conveyer 38 in the lateral direction (direction X in FIGS. 1 and 5) so that the first transfer position J1 of the first transport conveyer 37 is located at the position below (preferably directly below) the travel rails 1 and the second transfer position J2 of the second transport conveyer 38 is located at the position to a side of the travel rails 1 in plan view. Alternatively, the travel rails 1 may be located at a position above (preferably directly above) the second transfer position J2 of the second transport conveyer 38, i.e. at a position closer to the article storage 6 in the lateral direction (direction X in FIGS. 1 and 5) so that the first transfer position J1 of the first transport conveyer 37 is located at a position to a side of the travel rails 1 in plan view and the second transfer position J2 of the second transport conveyer 38 is located at a position below (preferably directly below) the travel rails 1. For example, only the travel rails 1 located on the right-hand side in the direction X in FIGS. 6 and 7, may be provided. And the article transport vehicle 2 may travel along those travel rails 1.

(3) In the first and second embodiments above, the article transport vehicle 2 is configured to transfer an article 3 to or from the second transfer positions J2 of the second transport conveyer 38 by vertically moving the grip portion 4 after slidingly moving the grip portion 4 along the lateral direction (direction X in FIG. 1). Alternatively, the height of the second transport conveyer 38 may be set such that the article transport vehicle 2 can transfer an article 3 to or from the second transfer positions J2 of the second transport conveyer 38 only by slidingly moving the grip portion 4 in the lateral direction (direction X in FIG. 1) without moving it vertically.

(4) The installation location of the article storage 6 is not limited to those disclosed in the first and second embodiments and may be altered suitably. And when the installation location of the article storage 6 is changed, the facility can be adapted to the change by making corresponding changes to the lengths, and/or the transporting directions, etc. of the first transport conveyer 37 and the second transport conveyer 38.

What is claimed is:
1. An article transport facility comprising:
an article transport vehicle that is capable of traveling along a travel rail provided on a ceiling side;
an article storage including a plurality of storage units, the storage units being arranged in a vertical direction and being capable of storing articles that are transported by the article transport vehicle, wherein the article storage is located to a side of the travel rail in plan view and includes a take-in portion for receiving articles to be stored in the storage units from the article transport vehicle and a take-out portion for delivering articles to be retrieved from the storage units to the article transport vehicle;

a first transport conveyer for transporting an article between a first transfer position outside the article storage and a position inside the article storage;

a second transport conveyer, located on a same side of the article storage as the first transport conveyor and outside the article storage and at a higher position than the first transport conveyer, for transporting an article between a second transfer position that is outside the article storage and that is located closer to the article storage than the first transfer position in plan view and a position inside the article storage;

wherein the article transport vehicle includes a grip portion for gripping an article such that the grip portion can be vertically moved and slidingly moved in a lateral direction of the travel rail, wherein the article transport vehicle including the grip portion is configured to be capable of transferring an article to or from one of the first transfer position and the second transfer position by vertically moving the grip portion with the article transport vehicle stopped at a transfer stop position in a path defined by the travel rail, and is configured to be capable of transferring an article to or from the other of the first transfer position and the second transfer position at least by slidingly moving the grip portion in the lateral direction with the article transport vehicle stopped at the transfer stop position, wherein one of the first transport conveyer and the second transport conveyer is configured to function as the take-in portion, and the other of the first transport conveyer and the second transport conveyer is configured to function as the take-out portion.

2. The article transport facility as defined in claim 1, wherein one of the first transport conveyer and the second transport conveyer whose transfer position, which is either the first transfer position or the second transfer position, is located directly below the travel rail is configured to function as the take-out portion whereas the other of the first transport conveyer and the second transport conveyer is configured to function as the take-in portion.

3. The article transport facility as defined in claim 1, wherein the article storage is configured such that a top end portion thereof is located higher than, or at substantially the same height as, the article transport vehicle in the vertical direction.

4. The article transport facility as defined in claim 1, wherein the first transport conveyer and the second transport conveyer are located in an intermediate portion of the article storage in the vertical direction such that the first and second transport conveyers are vertically aligned with each other and close to each other in the vertical direction.

5. The article transport facility as defined in claim 1, wherein an article storage transport device is provided for transporting an article among a first transport position which is the position inside the article storage and to which an article is transported by the first transport conveyer, a second transport position which is the position inside the article storage and to which an article is transported by the second transport conveyer, and the plurality of storage units.

6. An article transport facility comprising:
   a rail supported by a ceiling;
   an article storage including a plurality of storage units that are arranged in a vertical direction and are configured to store articles, wherein the article storage is located to a side of the rail in plan view;
   a first transport conveyer, provided to the article storage such that the first transport conveyer projects from the article storage, for transporting an article between a first transfer position outside the article storage and a position inside the article storage;
   a second transport conveyer located on a same side of the article storage as the first transport conveyor, and provided to the article storage such that the second transport conveyer projects from the article storage and is located at a higher position than the first transport conveyer, for transporting an article between a second transfer position that is located outside the article storage and is closer to the article storage than the first transfer position in plan view and a position inside the article storage;
   an article transport vehicle configured to travel on the rail, wherein the article transport vehicle includes a lift for vertically moving a grip portion for gripping an article, and a sliding movement operation mechanism for moving the grip portion and the lift in a lateral direction between a retracted position at which the grip portion overlaps with the article transport vehicle in plan view and a side position displaced from the retracted position in the lateral direction,
   wherein, the first transport conveyer is located such that the first transfer position is located directly below one of the retracted position and the side position of the grip portion when the article transport vehicle is stopped at a transfer stop position in a path defined by the rail,
   wherein the second transport conveyer is located such that the second transfer position is located directly below the other of the retracted position of the grip portion and the side position when the article transport vehicle is stopped at the transfer stop position and such that an article can be transferred to the first transfer position of the first transport conveyer by lowering the article from the article transport vehicle using the grip portion.

7. The article transport facility as defined in claim 6, wherein one of the first transport conveyer and the second transport conveyer whose transfer position, which is either the first transfer position or the second transfer position, is located directly below the rail is configured to function as the take-out portion whereas the other of the first transport conveyer and the second transport conveyer is configured to function as the take-in portion.

8. The article transport facility as defined in claim 6, wherein the article storage is configured such that a top end portion thereof is located at the same height as or higher than the article transport vehicle in the vertical direction.

9. The article transport facility as defined in claim 6, wherein the first transport conveyer and the second transport conveyer are located in an intermediate portion of the article storage in the vertical direction such that the first and second transport conveyers are vertically aligned with each other and close to each other in the vertical direction.

10. The article transport facility as defined in claim 6, wherein a stacker crane is provided within the article storage, for transporting an article among a first transport position which is the position inside the article storage and to which an article is transported by the first transport conveyer, a second transport position which is the position inside the article storage and to which an article is transported by the second transport conveyer, and the plurality of storage units.

11. The article transport facility as defined in claim 1, wherein the first transport conveyer is located in an intermediate portion of the article storage in the vertical direction.

12. The article transport facility as defined in claim 6, wherein the first transport conveyer is located in an intermediate portion of the article storage in the vertical direction.

13. The article transport facility as defined in claim 1, wherein the first transport conveyer projects farther from the article storage than the second transport conveyer.

14. The article transport facility as defined in claim 6, wherein the first transport conveyer projects farther from the article storage than the second transport conveyer.

15. The article transport facility as defined in claim 1, wherein the article transport vehicle includes an article support having the grip portion and a sliding movement operation mechanism provided to the article support for moving the grip portion along the lateral direction, wherein the sliding movement operation mechanism includes a first slide movement member which can be moved along the lateral direction with respect to the article support, and a second slide movement member which can be moved along the lateral direction with respect to the first slide movement member, and wherein the grip portion is provided to the second slide movement member.

16. The article transport facility as defined in claim 6, wherein the article transport vehicle includes an article support having the lift, the grip portion, and the sliding movement operation mechanism, wherein the sliding movement operation mechanism includes a first slide movement member which can be moved along the lateral direction with respect to the article support, and a second slide movement member which can be moved along the lateral direction with respect to the first slide movement member, and wherein the lift and the grip portion are provided to the second slide movement member.

* * * * *